(12) United States Patent
Choi et al.

(10) Patent No.: US 10,991,814 B2
(45) Date of Patent: Apr. 27, 2021

(54) THREE-DIMENSIONAL TUNNELING FIELD-EFFECT TRANSISTOR AND METHOD OF FABRICATING THE SAME

(71) Applicant: Industry-University Cooperation Foundation Hanyang University, Seoul (KR)

(72) Inventors: Chang Hwan Choi, Seoul (KR); Dong Hwan Lim, Suwon-si (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 16/567,615

(22) Filed: Sep. 11, 2019

(65) Prior Publication Data

US 2020/0176592 A1    Jun. 4, 2020

(51) Int. Cl.
*H01L 29/66*      (2006.01)
(52) U.S. Cl.
CPC .............................. *H01L 29/66977* (2013.01)
(58) Field of Classification Search
CPC ................................................ H01L 29/66977
See application file for complete search history.

(56) References Cited

U.S. PATENT DOCUMENTS 9,526,436 B2 * 12/2016 Xu ..................... H01L 29/78624
2012/0032227 A1   2/2012 Seabaugh et al.
2018/0040707 A1 * 2/2018 Park ................. H01L 21/823431

FOREIGN PATENT DOCUMENTS

KR   10-2014-0078326 A    6/2014
KR   10-2016-0097448 A    8/2016

OTHER PUBLICATIONS

Lim, Donghwan, "Tunnel Field Effect Transistor with High-K/Metal Gate Stack and Band Gap Engineering", Thesis for the Doctor of Philosophy, Graduate School of Hanyang University, Feb. 2019, pp. 1-151 (total 174 pages).
Communication dated Nov. 20, 2019 from Korean Intellectual Property Office in counterpart KR Application No. 10-2018-0081688.

(Continued)

*Primary Examiner* — Lex H Malsawma
*Assistant Examiner* — Xia L Cross
(74) *Attorney, Agent, or Firm* — Sughrue Mion, PLLC (57) ABSTRACT

Disclosed are a three-dimensional tunneling field-effect transistor and a method of fabricating the same. A method of fabricating a three-dimensional tunneling field-effect transistor according to an embodiment of the present disclosure includes growing a buffer layer, an embedded source layer, an etch stop layer, an active source layer, a channel layer, and a drain layer on a substrate; depositing a metal layer on the drain layer, and then forming a pattern in a mesa structure shape; forming a vertical gate at one end of each of the etch stop layer, the active source layer, the channel layer, and the drain layer; isolating the active source layer from the substrate to form a first air bridge; isolating the drain layer from the substrate to form a second air bridge; and isolating the vertical gate from the substrate to form a third air bridge.

7 Claims, 6 Drawing Sheets

(56) References Cited

OTHER PUBLICATIONS

Vinay Kumar Chinni, et al., "V-Shaped InAs/Al0.5Ga0.5Sb Vertical Tunnel FET on GaAs (001) Substrate With ION = 433µA.µm-1 at VDS = 0.5 V", Journal of the Electron Devices Society, Jan. 2017, pp. 53-58, vol. 5, No. 1.
Tao Yu, et al., "In0.53Ga0.47As/GaAs0.5Sb0.5 Quantum-Well Tunnel-FETs With Tunable Backward Diode Characteristics", IEEE Electron Device Letters, Dec. 2013, pp. 1503-1505, vol. 34, No. 12.

\* cited by examiner

THREE-DIMENSIONAL TUNNELING FIELD-EFFECT TRANSISTOR AND METHOD OF FABRICATING THE SAME

CROSS-REFERENCE TO RELATED APPLICATION

This application claims the priority benefit of Korean Patent Application No. 10-2018-0081688, filed on Jul. 13, 2018 in the Korean Intellectual Property Office, the disclosure of which is incorporated herein by reference.

BACKGROUND OF THE DISCLOSURE

Field of the Disclosure

The present disclosure relates to a three-dimensional tunneling field-effect transistor and a method of fabricating the same, and more particularly to a three-dimensional tunneling field-effect transistor including a plurality of air bridges serving to physically separate a source, a drain, and a gate from a substrate, thereby being capable of minimizing resistance and current loss due to the substrate and thus improving electrical characteristics of a device, and a method of fabricating the three-dimensional tunneling field-effect transistor.

Description of the Related Art

In the case of Tunneling Field-Effect Transistors (TFETs), a source and a drain are formed on opposite sides of a channel layer using impurities having opposite polarities.

In the case of an n-channel tunneling field-effect transistor, a tunneling junction having an energy band gradient is formed between a channel layer and a source when a positive (+) driving voltage is applied to a gate and a reverse bias voltage is applied to each of a source and a drain, so that tunneling of electrons (e) at a valence band (Ev) of the source to a conduction band (Ec) of a channel layer in a band-to-band manner occurs and driving current ($I_{ON}$) flows.

A p-channel tunneling field-effect transistor has a symmetrical structure to a structure of the n-channel tunneling field-effect transistor and operates symmetrically thereto.

The structural and operational characteristics of tunneling field-effect transistors allow the problem that a subthreshold swing (SS) cannot be lowered to 60 mV/dec or less at room temperature, which is a physical limit of existing Metal Oxide Semiconductor Field Effect Transistors (MOSFETs), to be overcome. Accordingly, there has been much research into next-generation devices that can replace MOSFETs.

However, such tunneling field-effect transistors do not exhibit sufficient performance to replace existing MOSFETs due to low driving current, an ambipolar behavior problem, parasitic capacitance between a gate and a drain, etc.

In addition, in the case of a compound substrate used in tunneling field-effect transistors, there are difficulties in accomplishing crystal growth due to lattice mismatch. When such crystal growth is not satisfactorily accomplished, mobility, interface trap, a band gap, etc. may be deteriorated.

With regard to this, nanowires, etc. have been utilized. However, there are problems that process difficulty is high and optimization of an interface, improvement of mobility, etc. cannot be structurally accomplished.

RELATED ART DOCUMENTS

Patent Document

Korean Patent Application Publication No. 10-2016-0097448 entitled "LOW-POWER TUNNELING FIELD-EFFECT TRANSISTOR AND METHOD OF FABRICATING THE SAME"

Non-Patent Documents

VINAY KUMAR CHINNI et al., "V-Shaped InAs/$Al_{0.5}Ga_{0.5}Sb$ Vertical Tunnel FET on GaAs (001) Substrate With $I_{ON}$=433 µA·µm$^{-1}$ at VDS=0.5 V" (Nov. 22, 2016)

Tao Yu et al., "$In_{0.53}Ga_{0.47}As/GaAs_{0.5}Sb_{0.5}$ Quantum-Well Tunnel-FETs With Tunable Backward Diode Characteristics" (Nov. 8, 2013)

SUMMARY OF THE DISCLOSURE

Therefore, the present invention has been made in view of the above problems, and it is one object of the present invention to provide a three-dimensional tunneling field-effect transistor including a plurality of air bridges serving to physically separate a source, a drain, and a gate from a substrate, thereby being capable of minimizing resistance and current loss due to the substrate and a method of fabricating the three-dimensional tunneling field-effect transistor.

It is another object of the present invention to provide a three-dimensional tunneling field-effect transistor including a three-dimensional channel formed through air bridges, thereby being capable of improving electrical characteristics and reliability of a device, and a method of fabricating the three-dimensional tunneling field-effect transistor.

In accordance with an aspect of the present invention, the above and other objects can be accomplished by the provision of a method of fabricating a three-dimensional tunneling field-effect transistor, the method including: growing a buffer layer, an embedded source layer, an etch stop layer, an active source layer, a channel layer, and a drain layer on a substrate; depositing a metal layer on the drain layer, and then forming a pattern in a mesa structure shape; forming a vertical gate at one end of each of the etch stop layer, the active source layer, the channel layer, and the drain layer; isolating the active source layer from the substrate to form a first air bridge; isolating the drain layer from the substrate to form a second air bridge; and isolating the vertical gate from the substrate to form a third air bridge.

The first air bridge may be formed by etching portions of the embedded source layer and the etch stop layer, not the buffer layer.

The second air bridge may be formed by etching portions of the drain layer and the channel layer, not the active source layer.

The second air bridge may be formed to be spaced apart from the first air bridge.

The third air bridge may be formed by etching a portion of the embedded source layer under the vertical gate, not the buffer layer.

The method may further include depositing a gate insulating film at one end of each of the etch stop layer, the active source layer, the channel layer, and the drain layer.

The vertical gate may be formed by a lift-off process or an etching process.

The method may further include depositing a metal on the active source layer.

The vertical gate may be formed in a triple gate structure of surrounding three sides of the channel layer with the gate insulating film interposed therebetween.

The substrate may be formed of at least one of silicon germanium (SiGe), indium arsenide (InAs), gallium antimonide (GaSb), germanium tin (GeSn), indium phosphide (InP), indium gallium arsenide (InGaAs), gallium arsenide phosphide (GaAsP), aluminum indium arsenide (AlInAs), aluminum gallium arsenide (AlGaAs), gallium indium arsenide (GaInAs), and gallium indium phosphide (GaInP).

In accordance with another aspect of the present invention, there is provided a three-dimensional tunneling field-effect transistor fabricated according to the method.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In addition, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

Hereinafter, a method of fabricating a three-dimensional tunneling field-effect transistor according to an embodiment of the present disclosure is described in detail with reference to FIGS. 1A to 1E.

FIGS. 1A to 1E are sectional views illustrating a method of fabricating a three-dimensional tunneling field-effect transistor according to an embodiment of the present disclosure.

A three-dimensional tunneling field-effect transistor 100 according to an embodiment of the present disclosure includes a substrate 110, a buffer layer 112, an embedded source layer 114, an etch stop layer 116, an active source layer 118, a channel layer 120, a drain layer 122, a metal layer 124, a vertical gate 126, and a ohmic metal 130.

Figure 1A:
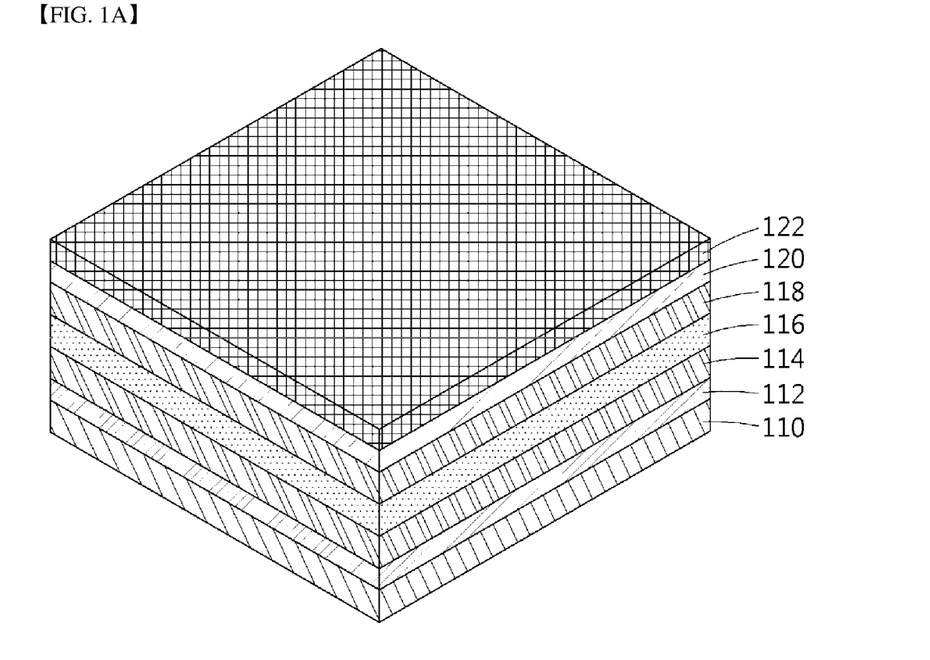
FIGS. 1A to 1E are sectional views illustrating a method of fabricating a three-dimensional tunneling field-effect transistor according to an embodiment of the present disclosure.

Referring to FIG. 1A, the three-dimensional tunneling field-effect transistor 100 according to an embodiment of the present disclosure is fabricated by preparing the substrate 110 and growing the buffer layer 112, the embedded source layer 114, the etch stop layer 116, the active source layer 118, the channel layer 120 and the drain layer 122 on the prepared substrate 110.

As shown in FIG. 1A, the substrate 110 is a substrate for supporting various components of a three-dimensional tunneling field-effect transistor. A material of the substrate 110 may be preferably a compound semiconductor, but the present disclosure is not specifically limited thereto.

For example, the substrate 110 may be formed of any one of silicon germanium (SiGe), indium arsenide (InAs), gallium antimonide (GaSb), germanium tin (GeSn), indium phosphide (InP), indium gallium arsenide (InGaAs), gallium arsenide phosphide (GaAsP), aluminum indium arsenide (AlInAs), aluminum gallium arsenide (AlGaAs), gallium indium arsenide (GaInAs) and gallium indium phosphide (GaInP), or a combination thereof, but may be formed of various materials without being limited thereto.

The buffer layer 112 may be grown on the substrate 110 and may alleviate lattice mismatch between the substrate 110 and the embedded source layer 114.

For example, the buffer layer 112 may be formed of any one of aluminum nitride (AlN), aluminum gallium nitride (AlGaN), gallium nitride (GaN), indium gallium nitride (InGaN), and indium nitride (InN), or a combination thereof, but may be formed of various materials without being limited thereto.

The embedded source layer 114, the etch stop layer 116, and the active source layer 118 may be grown on the buffer layer 112.

The embedded source layer 114 and the active source layer 118 may be formed by growing an N-type semiconductor layer. For example, an N-type semiconductor may be n-InAlGs.

The etch stop layer 116 may be formed between the embedded source layer 114 and the active source layer 118. For example, the etch stop layer 116 may be formed of any one of oxide, nitride, metals, and organic substances or a combination thereof, but may be formed of various materials without being limited thereto.

The channel layer 120 may be grown on the active source layer 118 and may be constituted of the same or different material from that of an embedded source layer, an active source layer, or a drain layer.

The drain layer 122 may be grown on the channel layer 120 and may be formed by growing a P-type semiconductor. For example, a P-type semiconductor layer may be p-InAlGs.

The buffer layer 112, the embedded source layer 114, the etch stop layer 116, the active source layer 118, the channel layer 120, and the drain layer 122 may epitaxially grow on the substrate 110 by a process such as Metal Organic Chemical Vapor Deposition (MOCVD) or Molecular Beam Epitaxy (MBE).

According to another embodiment, an embedded drain layer, an etch stop layer, an active drain layer, a channel layer, and a source layer may be grown on a substrate including the buffer layer formed thereon.

Figure 1B:
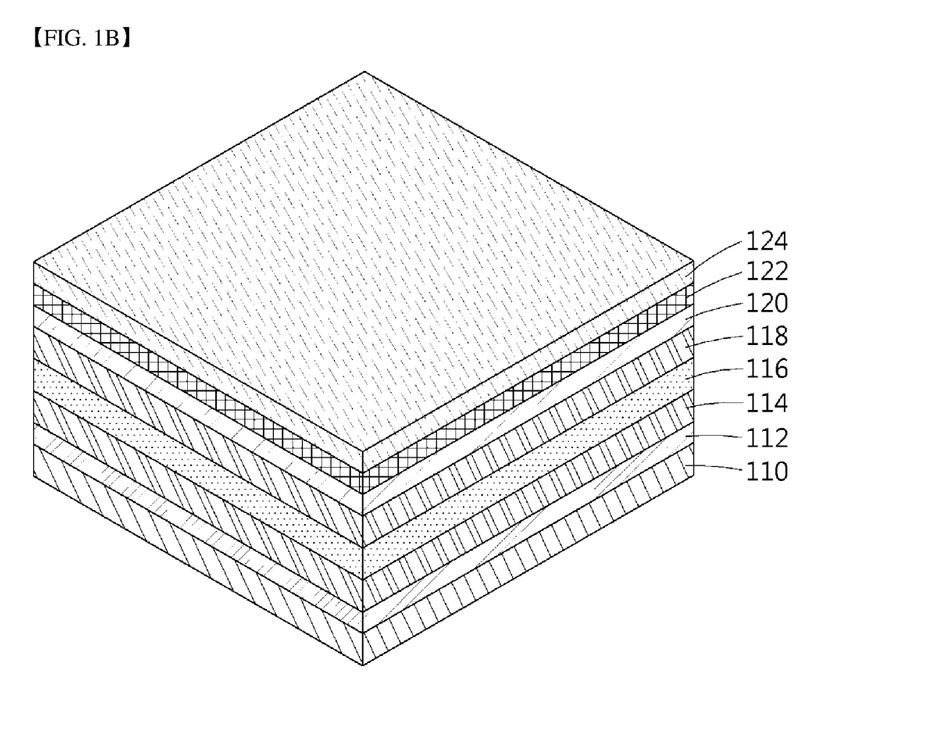
Figure 1C:
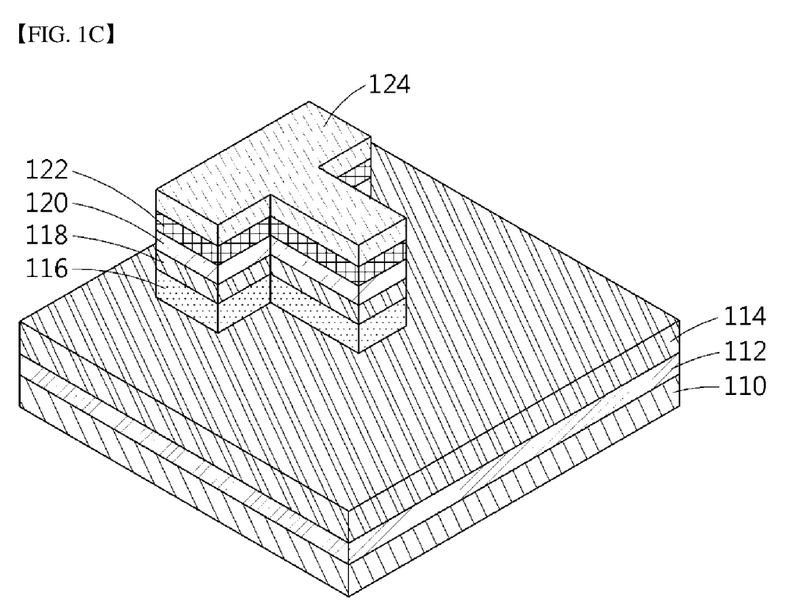

Referring to FIGS. 1B and 1C, the three-dimensional tunneling field-effect transistor 100 according to an embodiment of the present disclosure is fabricated by depositing the metal layer 124 on the drain layer 122, and then etching the same to form a mesa structure.

The metal layer 124 may be formed of any one of molybdenum (Mo), aluminum (Al), chromium (Cr), gold (Au), titanium (Ti), tungsten (W), nickel (Ni), neodymium (Nd), and copper (Cu) or a combination thereof, but may be formed of various materials without being limited thereto.

Even the etch stop layer 116 is etched to have a mesa structure after depositing the metal layer 124 on the drain layer 122, whereby the embedded source layer 114 may be exposed.

The etching may be dry etching or wet etching. However, the present disclosure is not limited as to the etching methods and known other methods may be used.

Figure 1D:
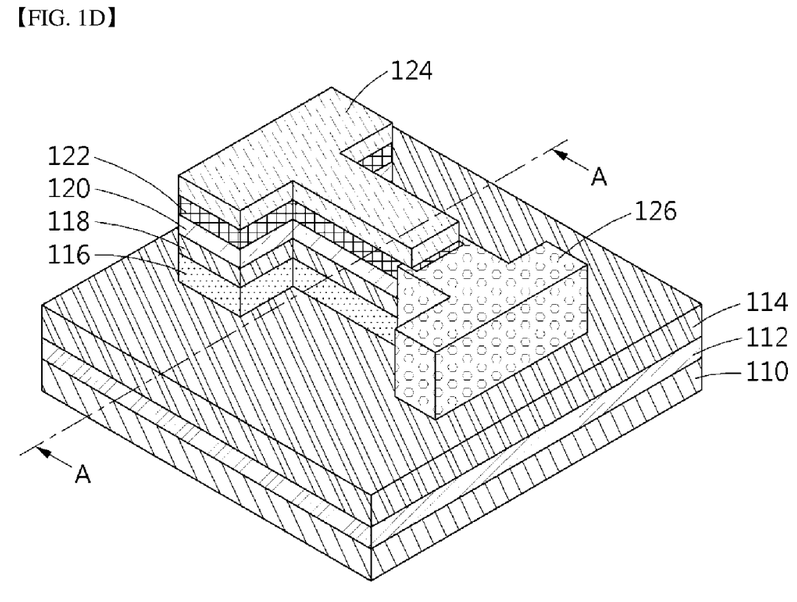

Referring to FIG. 1D, in the method of fabricating the three-dimensional tunneling field-effect transistor 100 according to an embodiment of the present disclosure, the vertical gate 126 is formed at one end of each of the etch stop layer 116, the active source layer 118, the channel layer 120 and the drain layer 122.

The vertical gate 126 may be formed by a lift-off process or an etching process. In addition, the vertical gate 126 may be formed of any one of molybdenum (Mo), aluminum (Al), chromium (Cr), gold (Au), titanium (Ti), tungsten (W), nickel (Ni), neodymium (Nd), and copper (Cu) or a combination thereof, but may be formed of various materials without being limited thereto.

In addition, a gate insulating film (not shown) may be further included between the etch stop layer 116, the active source layer 118, the channel layer 120, and the drain layer 122 and the vertical gate 126.

The gate insulating film may be formed using vacuum deposition, chemical vapor deposition, physical vapor deposition, or the like. In addition, the gate insulating film may be formed of an inorganic material, such as silicon oxide (SiOx), silicon nitride (SiNx), titanium oxide (TiOx), or hafnium oxide (HfOx) or an organic material, such as polyvinyl alcohol (PVA), polyvinylpyrrolidone (PVP), or polymethyl methacrylate (PMMA).

However, a material constituting the gate insulating film and a process method thereof are not limited to the above substances and methods, and other known materials and methods may be used.

The vertical gate 126 may be formed in a triple gate structure of surrounding three sides of the channel layer 120 with a gate insulating film interposed therebetween.

Figure 1E:
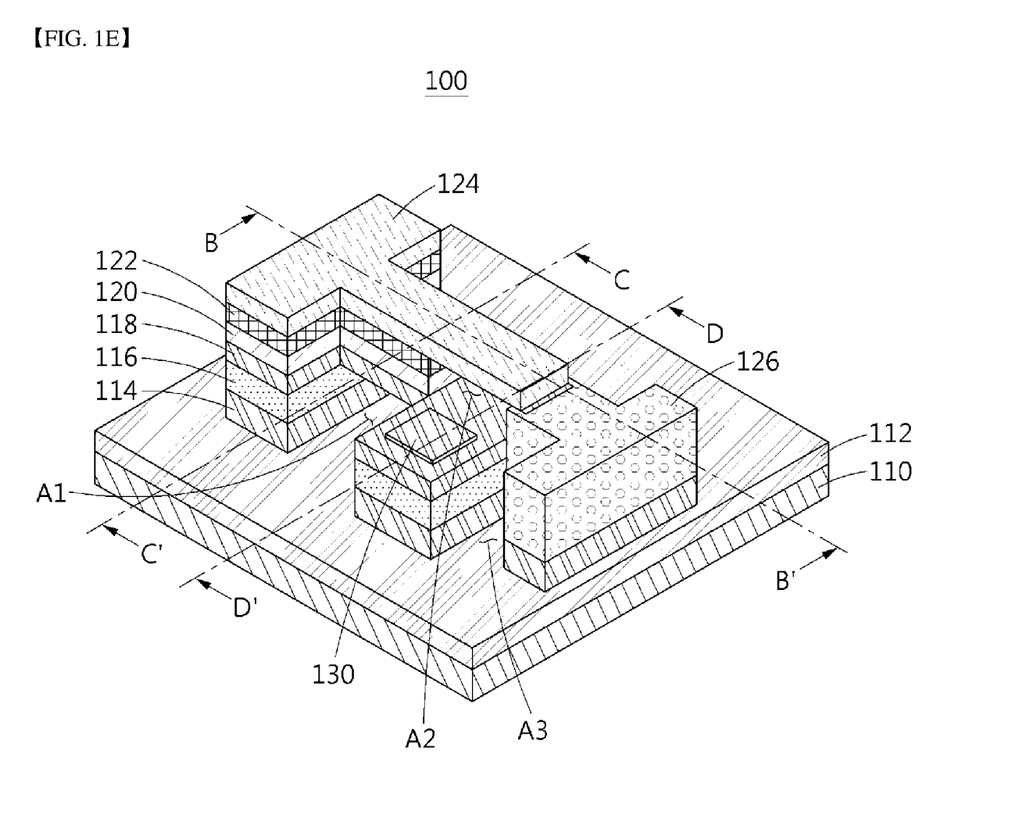

Referring to FIG. 1E, in the method of fabricating the three-dimensional tunneling field-effect transistor 100 according to an embodiment of the present disclosure, the plurality of air bridges A1, A2 and A3 are formed.

A first air bridge A1 may be formed by etching portions of the embedded source layer 114 and the etch stop layer 116, not the buffer layer 112, thereby isolating the active source layer 118 from the substrate 110.

A second air bridge A2 may be formed by etching portions of the drain layer 122 and the channel layer 120, not the active source layer 118, thereby isolating the drain layer 122 from the substrate 110. In addition, the second air bridge A2 may be formed to be spaced apart from the first air bridge A1.

A third air bridge A3 may be formed by etching a portion of the embedded source layer 114 under the vertical gate 126, not the buffer layer 112, thereby isolating the vertical gate 126 from the substrate 110.

The plurality of air bridges A1, A2 and A3 may be formed by wet-etching a portion, at which an air bridge is to be formed, of each of the active source layer 118, the drain layer 122, and the vertical gate 126.

In particular, a photoresist pattern is formed on each of the active source layer 118, the drain layer 122, and the vertical gate 126, and then a photoresist in areas, where the air bridges (A1, A2 and A3) are to be formed, is patterned by exposure and development processes.

Next, a wet etching process is performed using the patterned photoresist as a mask to form an air bridge (A1, A2, or A3) at each of the active source layer 118, the drain layer 122 and the vertical gate 126.

As examined above, the active source layer, the drain layer, and the vertical gate may be physically isolated from the substrate by forming the plurality of air bridges A1, A2 and A3, whereby it can be confirmed that resistance and current loss due to the substrate may be minimized.

After forming the plurality of air bridges A1, A2 and A3, an ohmic metal may be deposited on the active source layer.

The ohmic metal may be formed of any one of molybdenum (Mo), aluminum (Al), chromium (Cr), gold (Au), titanium (Ti), tungsten (W), nickel (Ni), neodymium (Nd), and copper (Cu) or a combination thereof, but may be formed of various materials without being limited thereto.

Figure 2A:
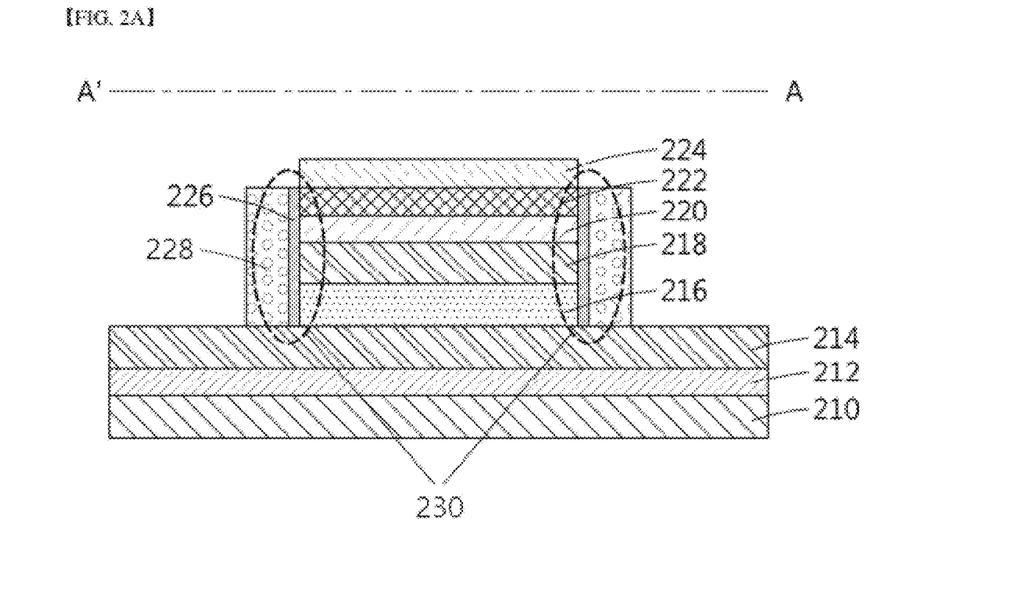
FIG. 2A illustrates a sectional view of the method of fabricating a three-dimensional tunneling field-effect transistor of FIG. 1D, and FIGS. 2B to 2D illustrate sectional views of the method of fabricating a three-dimensional tunneling field-effect transistor of FIG. 1E.

FIG. 2A illustrates a sectional view of the method of fabricating a three-dimensional tunneling field-effect transistor of FIG. 1D, and FIGS. 2B to 2D illustrate sectional views of the method of fabricating a three-dimensional tunneling field-effect transistor of FIG. 1E.

FIG. 2A illustrates a sectional view taken along line A-A' of FIG. 1D. Referring to FIG. 2A, the three-dimensional tunneling field-effect transistor according to an embodiment of the present disclosure includes a substrate 210, a buffer layer 212, an embedded source layer 214, an etch stop layer 216, an active source layer 218, a channel layer 220, a drain layer 222, and a metal layer 224.

Meanwhile, the three-dimensional tunneling field-effect transistor may further include a gate insulating film 226 and a vertical gate 228 formed on first side and second side of the channel layer 220.

In addition, a gate stack 230 includes the etch stop layer 216, the active source layer 218, the channel layer 220, the drain layer 222, the gate insulating film 226, and the vertical gate 228.

From FIG. 2A, it can be confirmed that the active source layer 218, the drain layer 222 and the vertical gate 228 share the channel layer 220, and the vertical gate 228 forms a triple gate structure surrounding three sides of the channel layer 220 with the gate insulating film 226 therebetween.

Figure 2B:
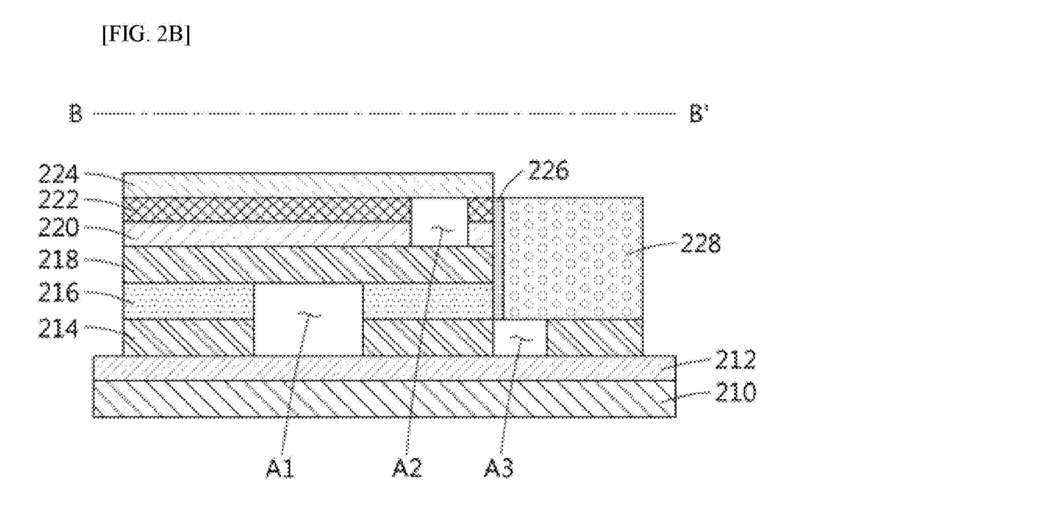

FIG. 2B illustrates a sectional view taken along line B-B' of FIG. 1E. Referring to FIG. 2B, the three-dimensional tunneling field-effect transistor according to an embodiment of the present disclosure includes the embedded source layer 214, etch stop layer 216, active source layer 218, channel layer 220, drain layer 222, and metal layer 224 formed on the substrate 210 on which the buffer layer 212 has been formed, the gate insulating film 226 and vertical gate 228 formed at one end of each of the embedded source layer 214, the etch stop layer 216, the active source layer 218, the channel layer 220, and the drain layer 222, and the plurality of air bridges A1, A2 and A3.

A first air bridge A1 may be formed by etching portions of the embedded source layer 214 and the etch stop layer 216, not the buffer layer 212, thereby isolating the active source layer 218 from the substrate 210.

A second air bridge A2 may be formed by etching portions of the drain layer 222 and the channel layer 220, not the active source layer 218, thereby isolating the drain layer 222 from the substrate 210. In addition, the second air bridge A2 may be formed to be spaced apart from the first air bridge A1.

A third air bridge A3 may be formed by etching a portion of the embedded source layer 214 under the vertical gate 226, not the buffer layer 212, thereby isolating the vertical gate 226 from the substrate 210.

Figure 2C:
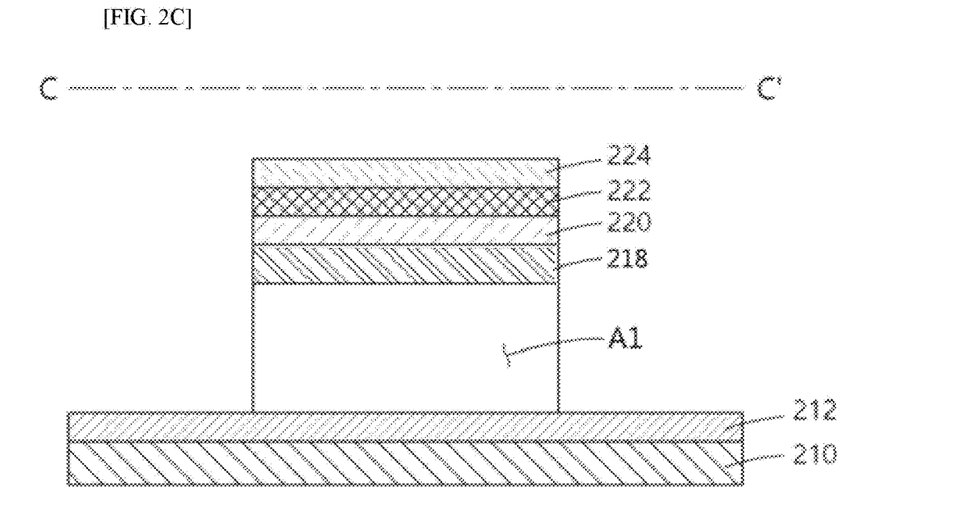

FIG. 2C illustrates a sectional view taken along line C-C' of FIG. 1E. Referring to FIG. 2C, it can be confirmed that the first air bridge A1 is formed between the substrate 210, on which the buffer layer 212 has been formed, and the channel layer 220, the drain layer 222 and the metal layer 224, thereby isolating the active source layer 218 from the substrate 210.

Figure 2D:
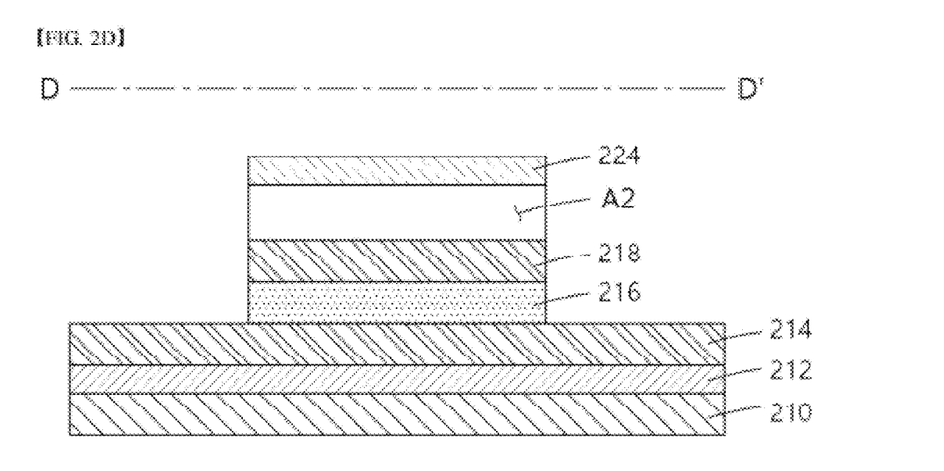

FIG. 2D illustrates a sectional view taken along line D-D' of FIG. 1E. Referring to FIG. 2D, it can be confirmed that the second air bridge A2 is formed between the substrate 210, the buffer layer 212, the embedded source layer 214, the etch stop layer 216, and the active source layer 218 and the metal layer 224.

As examined above, the three-dimensional tunneling field-effect transistor according to an embodiment of the present disclosure includes the plurality of air bridges A1, A2 and A3, whereby the active source layer, the drain layer, and the vertical gate may be physically isolated from the substrate. Accordingly, resistance and current loss due to the substrate may be minimized.

As apparent from the above description, the present invention can provide a three-dimensional tunneling field-effect transistor including a plurality of air bridges serving to physically separate an active source layer, a drain layer, and a vertical gate from a substrate, thereby being capable of minimizing resistance and current loss due to the substrate and a method of fabricating the three-dimensional tunneling field-effect transistor.

An embodiment of the present disclosure can provide a three-dimensional tunneling field-effect transistor including a three-dimensional channel formed through air bridges, thereby being capable of improving electrical characteristics and reliability of a device, and a method of fabricating the three-dimensional tunneling field-effect transistor.

Meanwhile, embodiments of the present invention disclosed in the present specification and drawings are only provided to help understanding of the present invention and the scope of the present invention is not limited to the embodiments. It will be apparent to those skilled in the art that various modifications can be made to the above-described exemplary embodiments of the present invention without departing from the spirit or scope of the invention.

DESCRIPTION OF SYMBOLS

100: TUNNELING FIELD-EFFECT TRANSISTOR
110: SUBSTRATE
112: BUFFER LAYER
114: EMBEDDED SOURCE LAYER
116: ETCH STOP LAYER
118: ACTIVE SOURCE LAYER
120: CHANNEL LAYER
122 DRAIN LAYER
124: METAL LAYER
126: VERTICAL GATE
130: OHMIC METAL

What is claimed is:
1. A method of fabricating a three-dimensional tunneling field-effect transistor, the method comprising:
   growing a buffer layer, an embedded source layer, an etch stop layer, an active source layer, a channel layer, and a drain layer on a substrate;
   depositing a metal layer on the drain layer, and then forming a pattern in a mesa structure shape;
   forming a vertical gate at one end of each of the etch stop layer, the active source layer, the channel layer, and the drain layer;
   forming a first air bridge by etching portions of the embedded source layer and the etch stop layer, not the buffer layer;
   forming a second air bridge by etching portions of the drain layer and the channel layer, not the active source layer, the second air bridge is spaced apart from the first air bridge; and forming a third air bridge by etching a portion of the embedded source layer under the vertical gate, not the buffer layer, the third air bridge is spaced apart from the first and second air bridge.

2. The method according to claim 1, further comprising depositing a gate insulating, film at one end of each of the etch stop layer, the active source layer, the channel layer, and the drain layer.

3. The method according to claim 1, wherein the vertical gate is formed by a lift-off process or an etching process.

4. The method according to claim 1, further comprising depositing an ohmic metal on the active source layer.

5. The method according to claim 1, wherein the vertical gate is formed in a triple gate structure of surrounding three sides of the channel layer with a gate insulating film interposed therebetween.

6. The method according to claim 1, wherein the substrate is formed of at least one of silicon germanium (Site), indium arsenide (InAs), gallium antimonide (GaSb), germanium tin (GeSn), indium phosphide (InP), indium gallium arsenide (InGaAs), gallium arsenide phosphide (GaAsP), aluminum indium arsenide (AlInAs), aluminum gallium arsenide (AlGaAs), gallium indium arsenide (GaInAs), and gallium indium phosphide (GaInP).

7. A three-dimensional tunneling field-effect transistor fabricated according to the method of claim 1.

* * * * *